(12) United States Patent
Jo

(10) Patent No.: US 7,425,511 B2
(45) Date of Patent: Sep. 16, 2008

(54) METHODS FOR MANUFACTURING SHALLOW TRENCH ISOLATION LAYERS OF SEMICONDUCTOR DEVICES

(75) Inventor: Bo Yeoun Jo, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 423 days.

(21) Appl. No.: 11/194,265

(22) Filed: Aug. 1, 2005

(65) Prior Publication Data
US 2006/0024913 A1    Feb. 2, 2006

(30) Foreign Application Priority Data
Jul. 30, 2004    (KR) ............... 10-2004-0060196

(51) Int. Cl.
*H01L 21/301* (2006.01)

(52) U.S. Cl. ............... 438/736; 438/424; 438/734
(58) Field of Classification Search ............ 438/424, 438/734, 736
See application file for complete search history.

(56) References Cited

U.S. PATENT DOCUMENTS 5,856,003 A * 1/1999 Chiu ................... 438/362
6,831,018 B2 * 12/2004 Kanegae ............. 438/706

* cited by examiner

*Primary Examiner*—Carl Whitehead, Jr.
*Assistant Examiner*—Colleen E Rodgers
(74) *Attorney, Agent, or Firm*—Andrew D. Fortney

(57) ABSTRACT

A method for forming a shallow trench isolation layer that includes: forming a pad oxide on a substrate; forming a hard mask silicon nitride on the pad oxide; forming a moat pattern on the pad oxide and hard mask; etching partially the pad oxide and hard mask with the moat pattern to open the silicon nitride; and ashing process for removing the moat pattern.

6 Claims, 5 Drawing Sheets

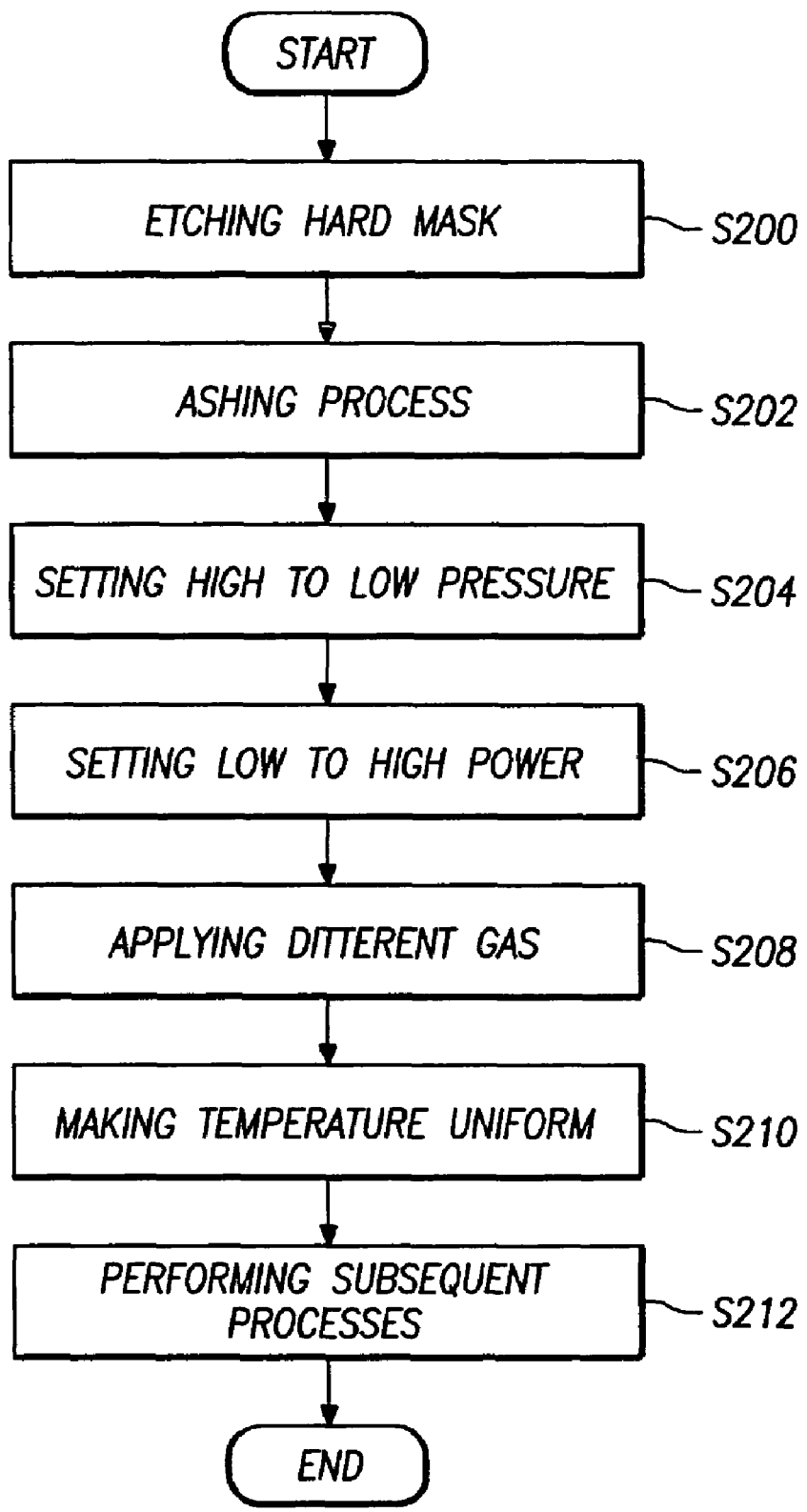

METHODS FOR MANUFACTURING SHALLOW TRENCH ISOLATION LAYERS OF SEMICONDUCTOR DEVICES

BACKGROUND OF THE INVENTION

1. Technical Field

The present disclosure relates to fabrication technologies for semiconductor devices and, more particularly, to methods for manufacturing shallow trench isolation layers in semiconductor devices.

2. Background

As the fabrication technologies of semiconductor devices develop and the application areas of the semiconductor devices expand, efforts to improve the integrity of the devices have been widely made. For increasing the integrity of integrated circuit (IC) devices, miniaturizations of isolation layers in the devices has become especially important among others.

One of the conventional isolation technologies is Local Oxidation of Silicon (LOCOS) in which thick silicon oxide isolation layer grows selectively on a semiconductor substrate. However, the LOCOS layer has limitation in decreasing the width of the isolation layer because of the lateral diffusion of oxidation. Thus, in IC devices having submicron design rules, the use of LOCOS isolation is not proper.

The conventional Shallow Trench Isolation (STI) technology is used to overcome the drawbacks of the LOCOS technology by forming a shallow trench using an etching process in a semiconductor substrate and filling the trench with insulating material.

FIGS. 1a to 1g are cross-sectional views of the manufacturing process of the conventional STI isolation layer in a semiconductor device.

Referring to FIG. 1a, a pad oxide ($SiO_2$ buffer layer) 12 having thickness of 100 Å to 200 Å grows by thermal oxidation on a silicon substrate 10. A silicon nitride ($Si_3N_4$) layer 14 having thickness of 1,000 Å to 2,000 Å is deposited as a hard mask on the pad oxide layer 12.

Referring to FIG. 1b, a moat pattern 16 that defines active and STI isolation areas is formed on the hard mask 14. The moat pattern 16 is formed by depositing a photo resist and exposing and developing the photo resist using the mask pattern of the STI.

Referring to FIG. 1c, the hard mask 14 and pad oxide 12 are patterned by a dry etching process with the use of the moat pattern 16. The dry etching of the hard mask 14 is performed by plasma dry etching of the target $Si_3N_4$ layer with an etchant gas of $CHF_3$, $O_2$ under Ar atmosphere in Magnetically Enhanced Reactive Ion Etching (MERIE) etching equipment. In this process, the flow rate of $CHF_3$ gas is 40 surface cubic centimeters per minute (sccm) to 80 sccm, $O_2$ gas is 0 sccm to 20 sccm, and Ar gas is 6 sccm to 120 sccm. The pressure of the MERIE equipment is 20 millitorr (mTorr) to 70 mTorr, and radio frequency (RF) power is 200 watts (W) to 300 W.

Then, as shown in FIG. 1d, the surface of the semiconductor substrate 10 exposed by the patterns of hard mask 14 and pad oxide 12 is dry etched by a predetermined depth, e.g., 3,000 Å to 5,000 Å to form a shallow trench 18 and the moat pattern 16 is removed.

On the inner walls of shallow trench 18 and the sides of pad oxide 12 and hard mask 14 a thin silicon oxide layer is formed as a liner insulating layer (not shown).

Referring to FIG. 1e, silicon oxide or Tetraetylorthosilicate (TEOS) is deposited as a gap-filling insulating layer to fill the shallow trench.

Then, as shown in FIG. 1f, Chemical Mechanical Polishing (CMP) is carried out to remove the gap-filling insulating layer 20 and liner insulating layer until the hard mark 14 is exposed. The CMP also planarizes the surface. Reference numeral 20a in the FIG. 1f represents the remaining gap-filling insulating layer after the CMP planarization process.

In FIG. 1g, the hard mask 14 is removed by phosphoric acid solution and the pad oxide 12 is partially removed by a cleaning process to form the final shallow trench isolation layer 20a.

As described, the conventional STI process employs the hard mask and opens the hard mask to form the STI structure by using the hard mask. Unfortunately, the use of hard mask in the STI process results in the occurrence of Si nodule, which degrades the reliability and lowers the productivity of the semiconductor device.

BRIEF DESCRIPTION OF DRAWINGS

FIG. 2 is a flow chart of one example disclosed process for forming shallow trench isolation structures in semiconductor devices.

DETAILED DESCRIPTION

As disclosed hererin an upper photo resist is removed by an ashing process under predetermined conditions. The ashing process is carried out after partial etching of a hard mask. Now, the processes performed prior to removing the upper photo resist are explained with reference to FIGS. 1a to 1d.

Figure 1A:
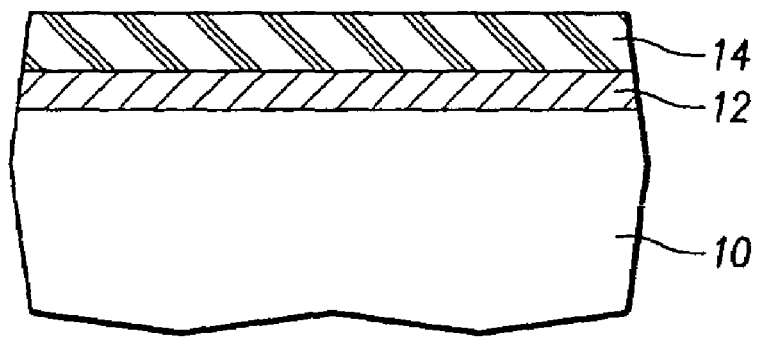
FIGS. 1a to 1g are cross-sectional views of a conventional trench isolation process.

Referring to FIG. 1a, a pad oxide ($SiO_2$ buffer layer) 12 having thickness of 100 Å to 200 Å grows by thermal oxidation on a silicon substrate 10. A silicon nitride ($Si_3N_4$) layer 14 having thickness of 1,000 Å to 2,000 Å is deposited as a hard mask on the pad oxide layer 12.

Figure 1B:
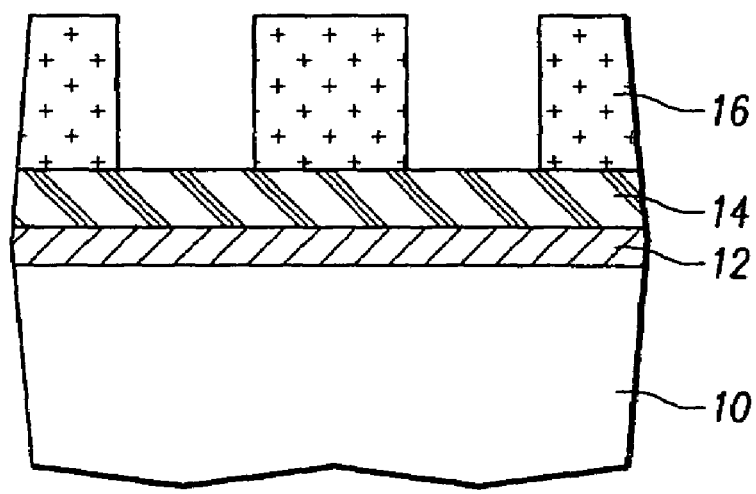

Referring to FIG. 1b, a moat pattern 16 that defines active and STI isolation areas is formed on the hard mask 14. The moat pattern 16 is formed by depositing a photo resist and exposing and developing the photo resist using the mask pattern of the STI.

Figure 1C:
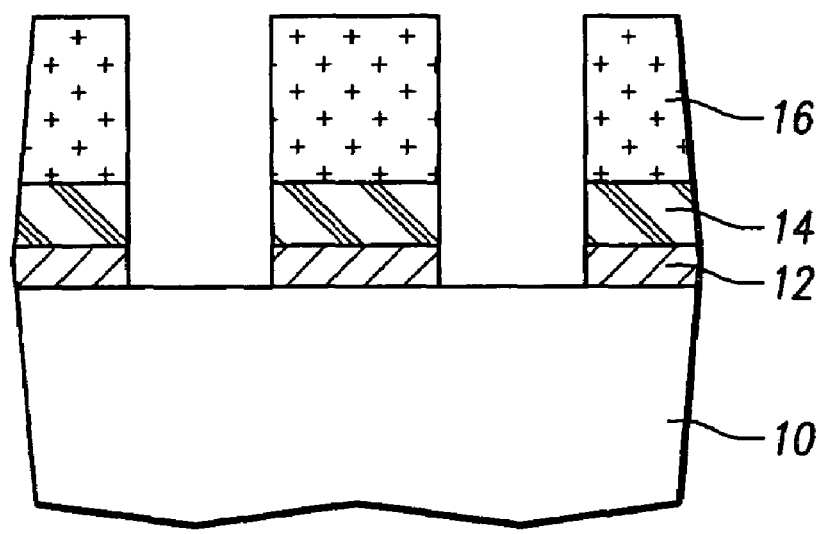

Referring to FIG. 1c, the hard mask 14 and pad oxide 12 are patterned by a dry etching process with the use of the moat pattern 16. The dry etching of the hard mask 14 may be carried out using plasma dry etching of the target $Si_3N_4$ layer with an etchant gas of $CHF_3$, $O_2$ under Ar atmosphere in MERIE etching equipment. In this process, the flow rate of $CHF_3$ gas is 40 sccm to 80 sccm, $O_2$ gas is 0 sccm to 20 sccm, and Ar gas is 6 sccm to 120 sccm. The pressure of the MERIE equipment is 20 mTorr to 70 mTorr, and RF power is 200 W to 300 W.

Figure 1D:
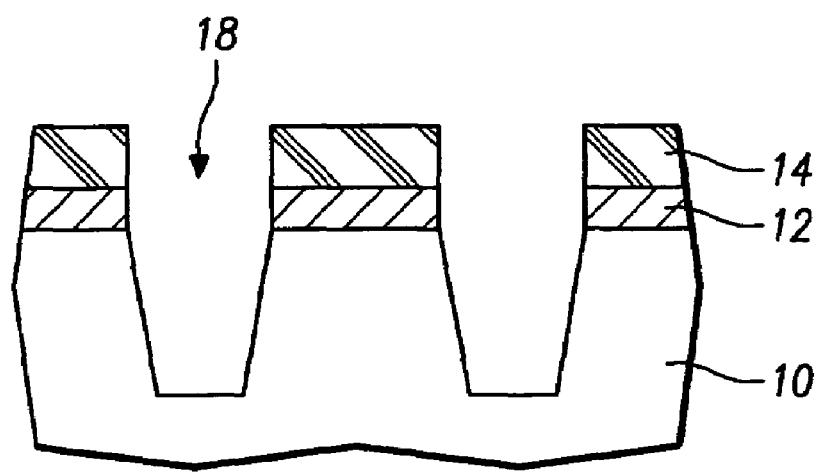
Figure 1E:
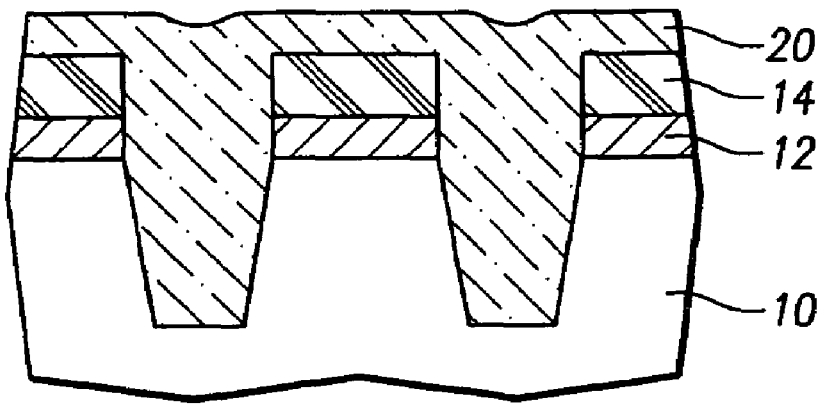
Figure 1F:
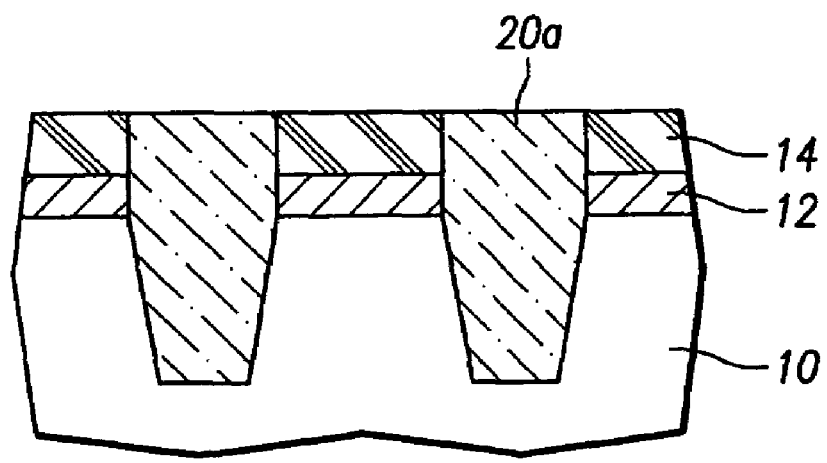
Figure 1G:
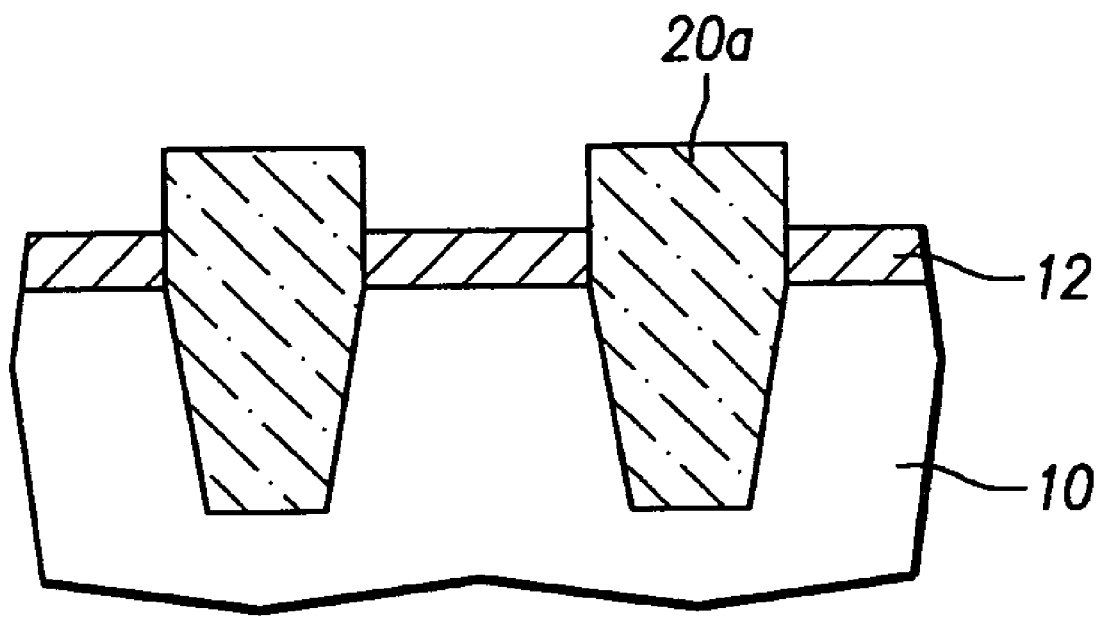

Then, as shown in FIG. 1d, the surface of the semiconductor substrate 10 exposed by the patterns of hard mask 14 and pad oxide 12 is dry etched by a predetermined depth, e.g., 3,000 Å to 5,000 Å to form a shallow trench 18 and the moat pattern 16 is removed.

According to one example, the photo resist is removed by an ashing process to which various conditions including pressure, power, gas, temperature, and time are applied. The conditions for the ashing process are explained with reference to FIG. 2.

In step S202 of FIG. 2, a photo resist ashing process is carried out after the etching of hard mask (as shown in FIGS. 1c and 1d) at step S200. In one example, the ashing process is performed to include the following steps or phases.

First: 1.5 Torr /800 W /3,500 $O_2$ /350 $N_2$ /15 second /220° C.

Second: 1 Torr /1,000 W /35,000 $O_2$ /350 $N_2$ /50 second /220° C.

Third: 0.5 Torr /1,200 W /35,000 $O_2$/25 second /220° C.

In the first to third steps of the ashing process, the pressure is set to vary from high to low pressure, such as, for example, from 1.5 Torr to 0.5 Torr (S204).

In the first to third steps of the ashing process, the power is set to vary from low to high power. For example, the power may vary from 600 W to 1,500 W (S206).

In the first to second steps of the ashing process, the $O_2/N_2$ gas is used, while in the third step $O_2$ gas is used (S208). At this time, the flow rate of $O_2$ may be, for example, 1,500 sccm to 4,000 sccm.

In one example, the processing time of the first step does not exceed 15 seconds. Further, the processing time of the second step may be equal to or less than 100 seconds, such as, for example, 50 seconds. The processing time of the third step may be set to be equal to or less than 50% of the processing time of the second step.

According to one example, in the first to third steps of the ashing process the temperature may be uniform. For example, the temperature of the processing may be 220° C. (S210).

When the ashing process is completed, subsequent processes that are identical or substantially identical to those of the conventional shallow trench isolation process are performed.

As described above, the ashing process removes the upper photo resist after the partial etching of the hard mask. Therefore, the processing described herein can prevent the formation of the Si nodule that may occur in processing steps according to the conventional technology for the shallow trench isolation, and improve the reliability of the semiconductor devices.

The processing described above provides a method for forming a shallow trench isolation layer in semiconductor devices that can prevent the Si nodule. According to one example, a process for forming a shallow trench isolation layer includes: forming a pad oxide on a substrate; forming a hard mask silicon nitride on the pad oxide; forming a moat pattern on the pad oxide and hard mask; etching partially the pad oxide and hard mask with the moat pattern to open the silicon nitride; and ashing process for removing the moat pattern. The ashing process is performed through sequentially performed first to third steps to each of which different pressure, power, gas, temperature and time parameters are applied respectively.

This patent application makes reference to, incorporates the same herein, and claims all benefits accruing under 35 U.S.C. § 119 from an application filed in the Korean Industrial Property Office on Jul. 30, 2005, and there duly assigned Ser. No. 10-2004-60196.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for forming a shallow trench isolation layer including:
    forming a pad oxide on a substrate;
    forming a hard mask silicon nitride on the pad oxide;
    forming a moat pattern on the pad oxide and hard mask;
    etching partially the pad oxide and hard mask with the moat pattern to open the silicon nitride; and
    performing an ashing process for removing the moat pattern, wherein the ashing process includes first to third steps performed sequentially using different pressure, power, gas, temperature, and time parameters, wherein the pressure is set to vary from high to low pressure in the first to third steps, the power is set to vary from low to high power in the first to third steps, the temperature is uniform in the first to third steps, and $O_2/N_2$ gas and $O_2$ gas are respectively used in the first to second and in the third steps.

2. The method of claim 1, wherein the pressure is 0.5 Torr to 1.5 Torr.

3. The method of claim 1, wherein the power is 600 W to 1,500 W.

4. The method of claim 1, wherein the processing time of the first step is equal to or less than 15 seconds.

5. The method of claim 1, wherein the processing time of the second step is equal to or less than 100 seconds.

6. The method of claim 1, wherein the processing time of the third step is equal to or less than 50% of the processing time of the second step.

\* \* \* \* \*